(12) United States Patent
Ho et al.

(10) Patent No.: US 10,347,766 B2
(45) Date of Patent: Jul. 9, 2019

(54) SEMICONDUCTOR DEVICE AND METHOD OF FABRICATING THE SAME

(71) Applicant: TAIWAN SEMICONDUCTOR MANUFACTURING CO., LTD., Hsinchu (TW)

(72) Inventors: Wei-Shuo Ho, New Taipei (TW); Chia-Ming Chang, Hsinchu (TW); Tsung-Yu Chiang, New Taipei (TW); Kuang-Hsin Chen, Taoyuan County (TW); Bor-Zen Tien, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/475,132

(22) Filed: Sep. 2, 2014

(65) Prior Publication Data
US 2016/0064567 A1 Mar. 3, 2016

(51) Int. Cl.
| H01L 21/76 | (2006.01) |
| H01L 29/78 | (2006.01) |
| H01L 29/66 | (2006.01) |
| H01L 29/51 | (2006.01) |
| H01L 21/02 | (2006.01) |

(52) U.S. Cl.
CPC ...... *H01L 29/7851* (2013.01); *H01L 21/0223* (2013.01); *H01L 29/511* (2013.01); *H01L 29/517* (2013.01); *H01L 29/6656* (2013.01); *H01L 29/6681* (2013.01)

(58) Field of Classification Search
None
See application file for complete search history.

(56) References Cited

U.S. PATENT DOCUMENTS

| 7,534,669 B2 * | 5/2009 | Anderson | H01L 21/84 257/353 |
| 2005/0148137 A1 * | 7/2005 | Brask | H01L 21/823821 438/216 |
| 2006/0071275 A1 * | 4/2006 | Brask | H01L 21/845 257/350 |
| 2008/0001187 A1 * | 1/2008 | Booth | H01L 29/66795 257/288 |
| 2008/0135888 A1 * | 6/2008 | Lee | H01L 29/045 257/255 |
| 2010/0240204 A1 * | 9/2010 | Yeh | H01L 21/02068 438/585 |
| 2011/0062518 A1 * | 3/2011 | Chan | H01L 29/66795 257/347 |

(Continued)

*Primary Examiner* — Herve-Louis Y Assouman
*Assistant Examiner* — Herve Assouman
(74) *Attorney, Agent, or Firm* — McDermott Will & Emery LLP

(57) ABSTRACT

Embodiments of the present disclosure relate generally to a semiconductor device and method of fabricating the same, the semiconductor device includes a semiconductor substrate and a gate stack disposed over a channel region of the semiconductor device, the gate stack includes an oxidation layer, a gate dielectric and a gate electrode, the oxidation layer at least covers a portion of the channel region of the semiconductor device and may act as a barrier to prevent damage to the underlying features, such as the source and drain regions, during removal of a dummy gate in a gate last process.

20 Claims, 13 Drawing Sheets

(56) References Cited

U.S. PATENT DOCUMENTS

| | | | |
|---|---|---|---|
| 2011/0223736 A1* | 9/2011 | Lin | H01L 21/823821 438/305 |
| 2012/0306028 A1* | 12/2012 | Wang | H01L 21/28202 257/411 |
| 2013/0161762 A1* | 6/2013 | Kelly | H01L 29/66795 257/401 |
| 2013/0203230 A1* | 8/2013 | Chen | H01L 29/66477 438/287 |
| 2014/0015063 A1* | 1/2014 | Yang | H01L 21/8238 257/369 |
| 2014/0183642 A1* | 7/2014 | Liang | H01L 21/823412 257/368 |

\* cited by examiner

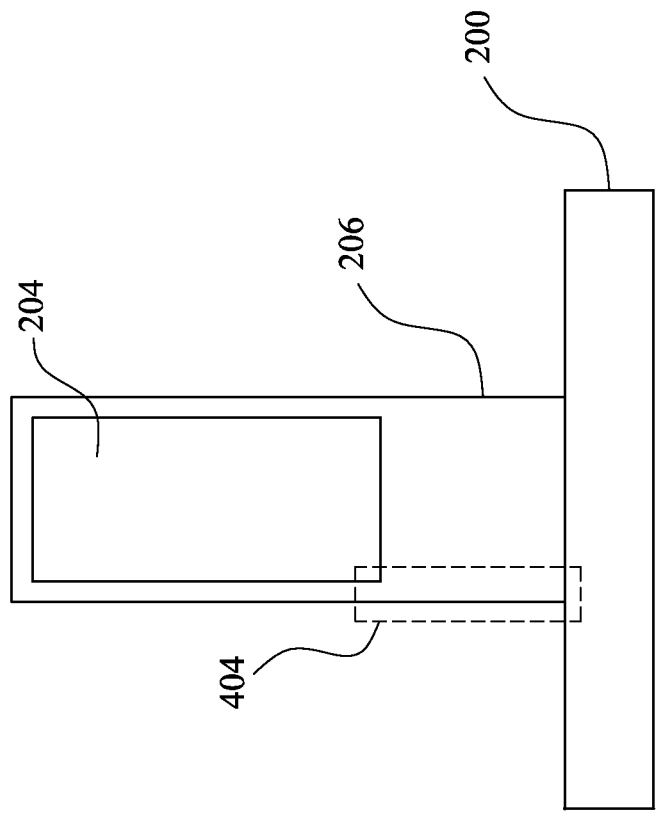
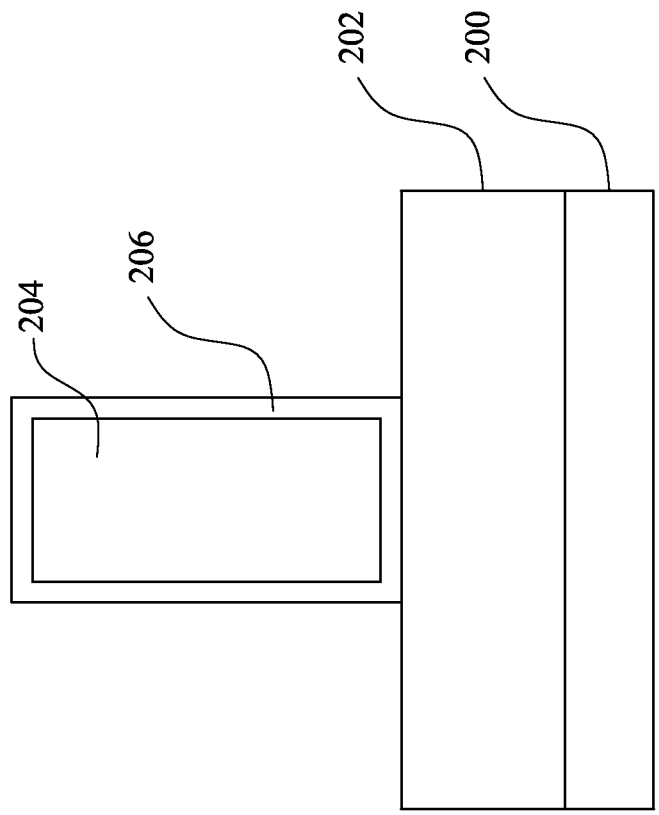

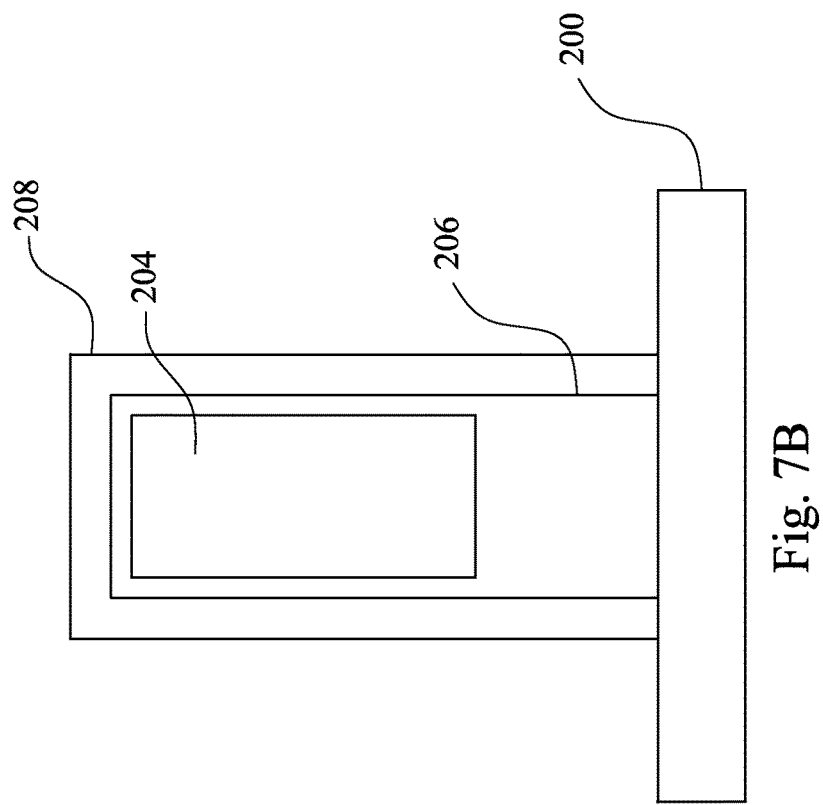
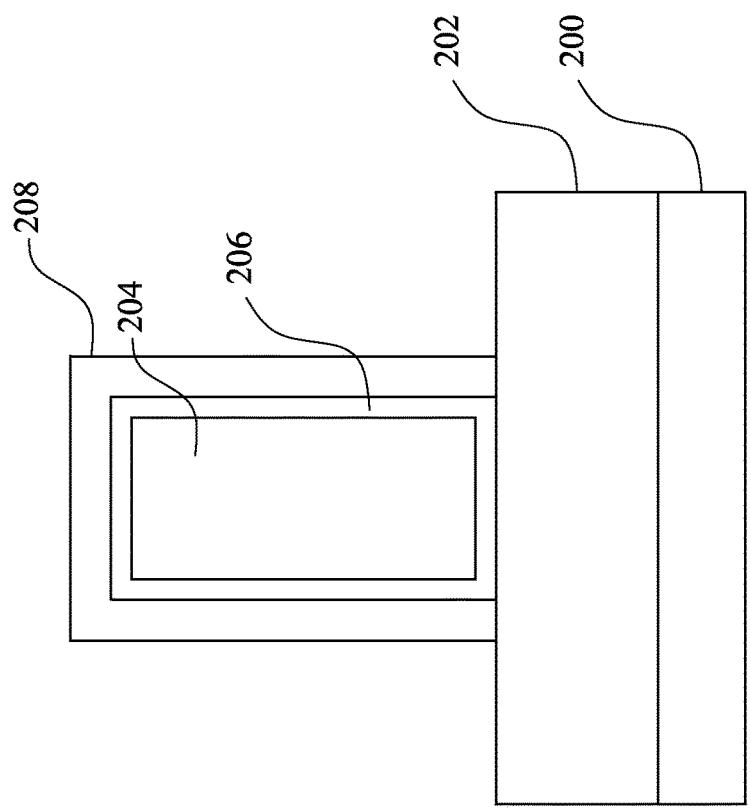

SEMICONDUCTOR DEVICE AND METHOD OF FABRICATING THE SAME

BACKGROUND

Polysilicon has been used in semiconductor devices due to its thermal resistive properties during high temperature processes, which allows it to be annealed at high temperatures along with source/drain structures and to block the channel region from doping atoms and form self aligned source/drain structures. As technology nodes shrink, there has been a desire to replace a gate electrode made of polysilicon with a metal gate electrode to improve device performance with the decreased feature size.

A gate last process may be implemented to replace the polysilicon gate electrode with a metal gate electrode. The gate last process refers to the metal gate structure being formed after the formation of the source/drain structures. However, problems arise when replacing the polysilicon gate electrode with a metal gate electrode. Since a high amount of etchant is applied to remove the polysilicon to prevent residues, the etchant could penetrate through weak points of the sidewall of the gate structure and damage the underlying features such as the source and drain regions. Therefore, the damage issue to the underlying features needs to be addressed to obtain the desired device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A and 6B are cross-sectional views of the Fin-FET device in FIG. 5 along the line AA and BB respectively, in accordance with some embodiments.

FIGS. 7A and 7B are schematic diagrams illustrating the Fin-FET device in FIGS. 6A and 6B with spacers formed thereon, in accordance with some embodiments.

DETAILED DESCRIPTION

Figure 1:
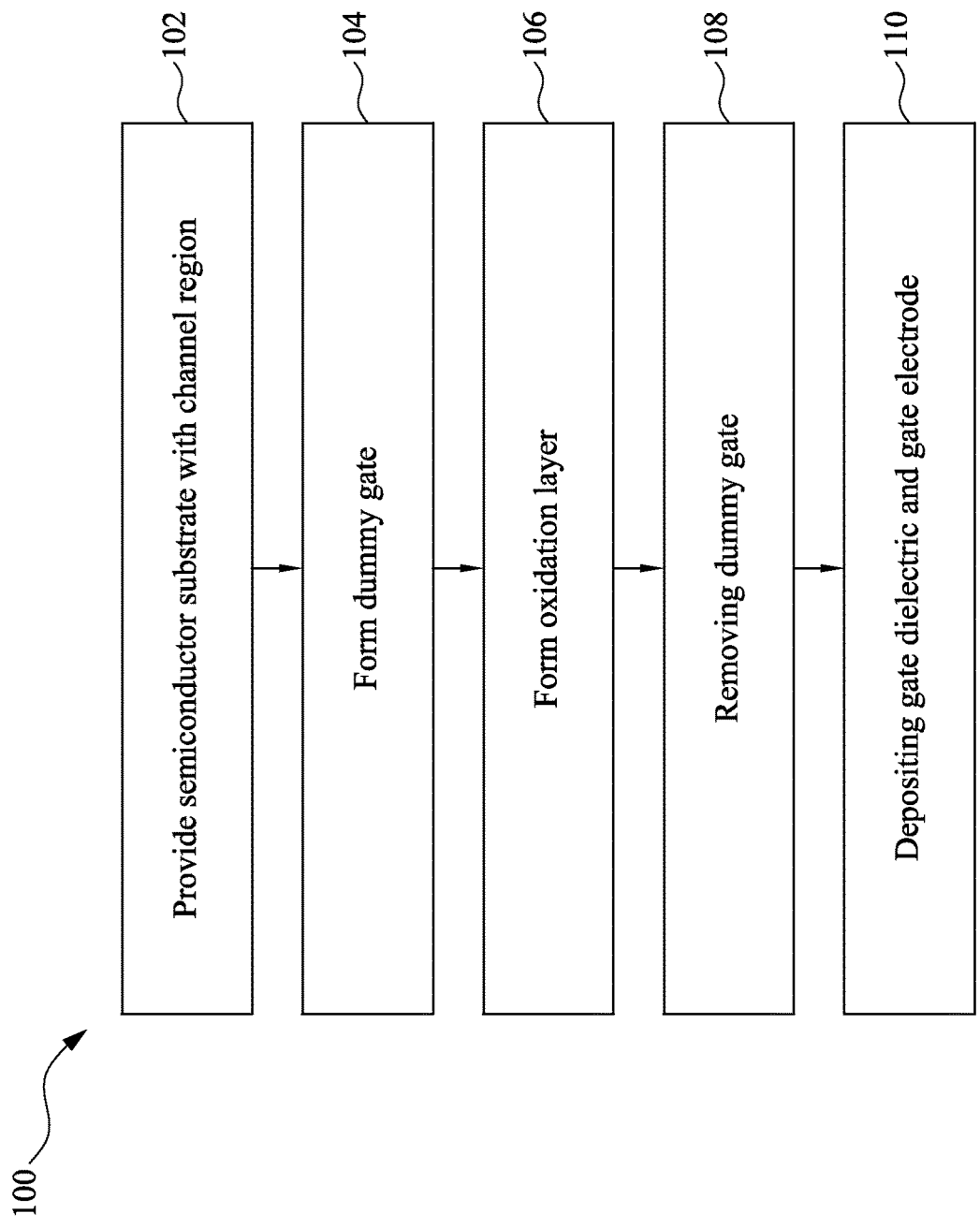
FIG. 1 is a flow chart illustrating a method of forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart illustrating a method of forming a semiconductor device, in accordance with some embodiments. FIGS. 2-9 are figures illustrating a Fin-FET device that may utilize the method depicted in FIG. 1, in accordance with some embodiments. With reference to FIGS. 1 through 9 and other figures, the method 100 and the Fin-FET device in FIGS. 2-9 are collectively described.

Figure 2:
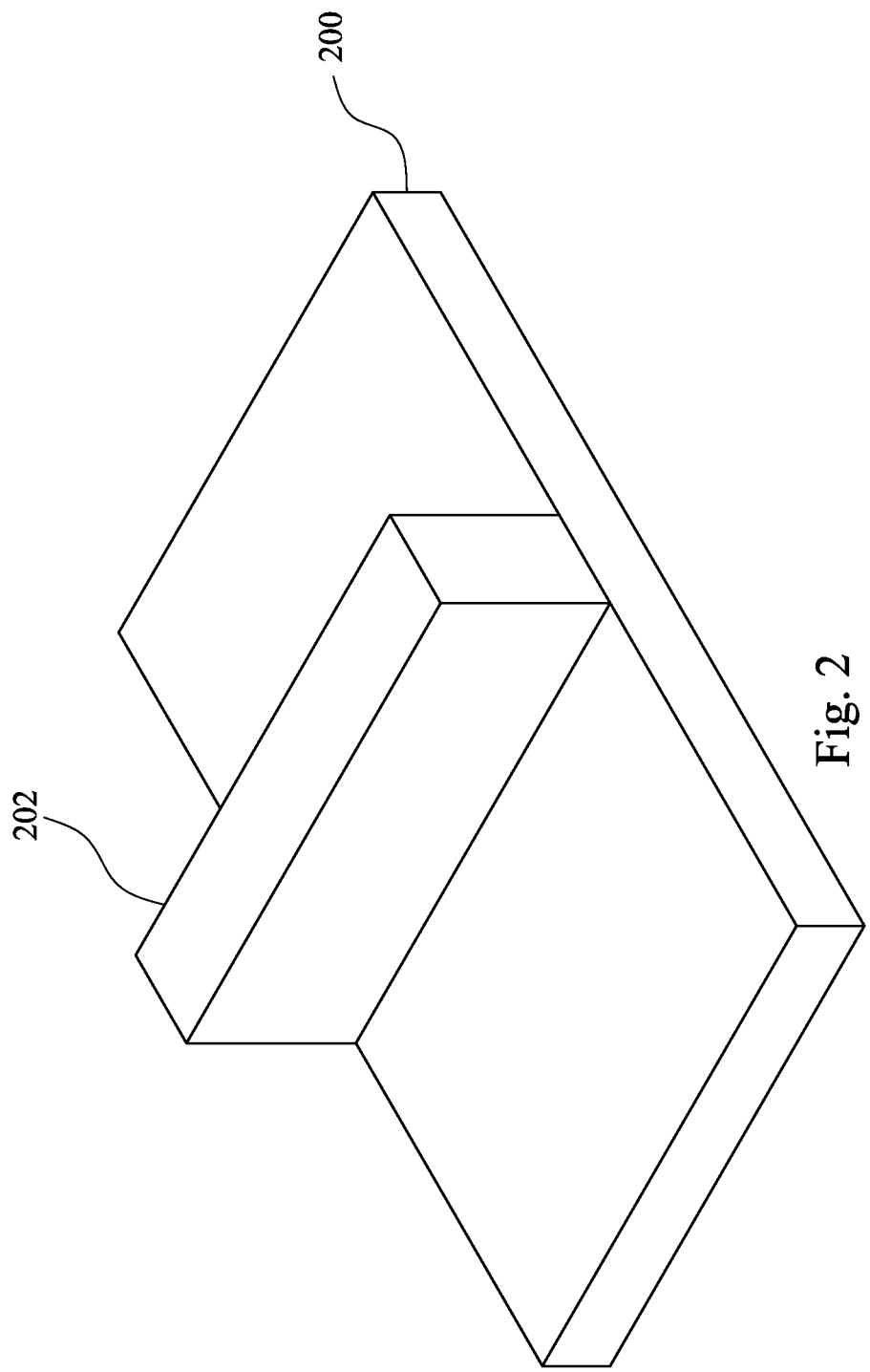
FIG. 2 is a perspective view of a Fin-FET device at an intermediate stage of fabrication that may utilize the method depicted in FIG. 1, in accordance with some embodiments.

Referring to FIGS. 1 and 2, the method 100 begins at operation 102, providing a semiconductor substrate with a channel region. The semiconductor device in FIG. 2 includes a substrate 200 and a fin structure 202. In some embodiments, the channel region is a channel region on the fin structure. The term "substrate" as used herein refers to a layer of material that serves as a basis for subsequent processing operations. One should note that some of the structures have been omitted for the purpose of simplicity and clarity.

In some embodiments, the substrate 200 may be a 200 mm, 300 mm or 450 mm silicon wafer, or other substrate used to fabricate microelectronic devices and the like. In one or more embodiments, the substrate 200 may be a material such as crystalline silicon (e.g., Si<100>, Si<111> or Si<001>), silicon oxide, strained silicon, silicon$_{(1-x)}$germanium$_x$, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. Furthermore, the substrate 200 can also include dielectric materials such as silicon dioxide, organosilicates, and carbon doped silicon oxides.

The substrate 200 may also include one or more conductive metals, such as nickel, titanium, platinum, molybdenum, rhenium, osmium, chromium, iron, aluminum, copper, tungsten, or combinations thereof. Furthermore, the substrate 200 can include any other materials such as metal nitrides, metal oxides and metal alloys, depending on the application. In some embodiments, the substrate 200 can form a contact structure, a metal silicide layer, or a gate structure including a gate dielectric layer and a gate electrode layer to facilitate connecting with an interconnect feature, such as a plug, via, contact, line, and wire, subsequently formed thereon, or suitable structures utilized in semiconductor devices.

In other embodiments, the substrate 200 may include a plurality of isolation structures such as shallow trench isolation (STI) structures to isolate the active regions. In another embodiment, the substrate 200 may be a bulk silicon substrate or a silicon-on-insulator substrate with expitaxial silicon disposed thereon.

In some embodiments, the fin structure 202 is formed by selectively etching the substrate 200. The substrate 200 may be selectively etched by forming a mask that defines areas of the finished device in which a fin structure desired, exposing the mask, removing portions of the mask, and selectively etching the substrate 200 with the patterned mask. In other embodiments, the fin structure 202 may have a tapered (sloped) sidewall. In some embodiments, the fin structure 202 may include a channel region and a source and drain region. In some embodiments, an oxide layer may be deposited on the top surface of the fin structure 202.

Referring to FIGS. 1, 3, 4A and 4B, the method 100 proceeds to operation 104, forming a dummy gate 204. In some embodiments, a dummy gate 204 may be formed by first forming a sacrificial layer on the substrate 200 and then selectively etching the sacrificial layer to form the dummy gate 204. In some embodiments, a portion of the outer surface of the dummy gate 204 may be oxidized and then the oxidized portion of the dummy gate 204 may be removed to reduce the width of the dummy gate 204. In other embodiments, the dummy gate 204 may have a tapered (sloped) sidewall. In another embodiment, the dummy gate 204 may be a material of polysilicon, other suitable materials and suitable materials doped with carbon or hydrogen. In some embodiments, the dummy gate 204 is formed over a channel region of the fin structure 202. In some embodiments, the dummy gate 204 is formed over a channel region of the fin structure 202 and a portion of the source and drain regions of the fin structure 202. In another embodiment, the dummy gate 204 with a tapered sidewall may be formed over a channel region of the fin structure 202 and a portion of the dummy gate 204 may cover the source and drain regions of the fin structure 202.

Figure 3:
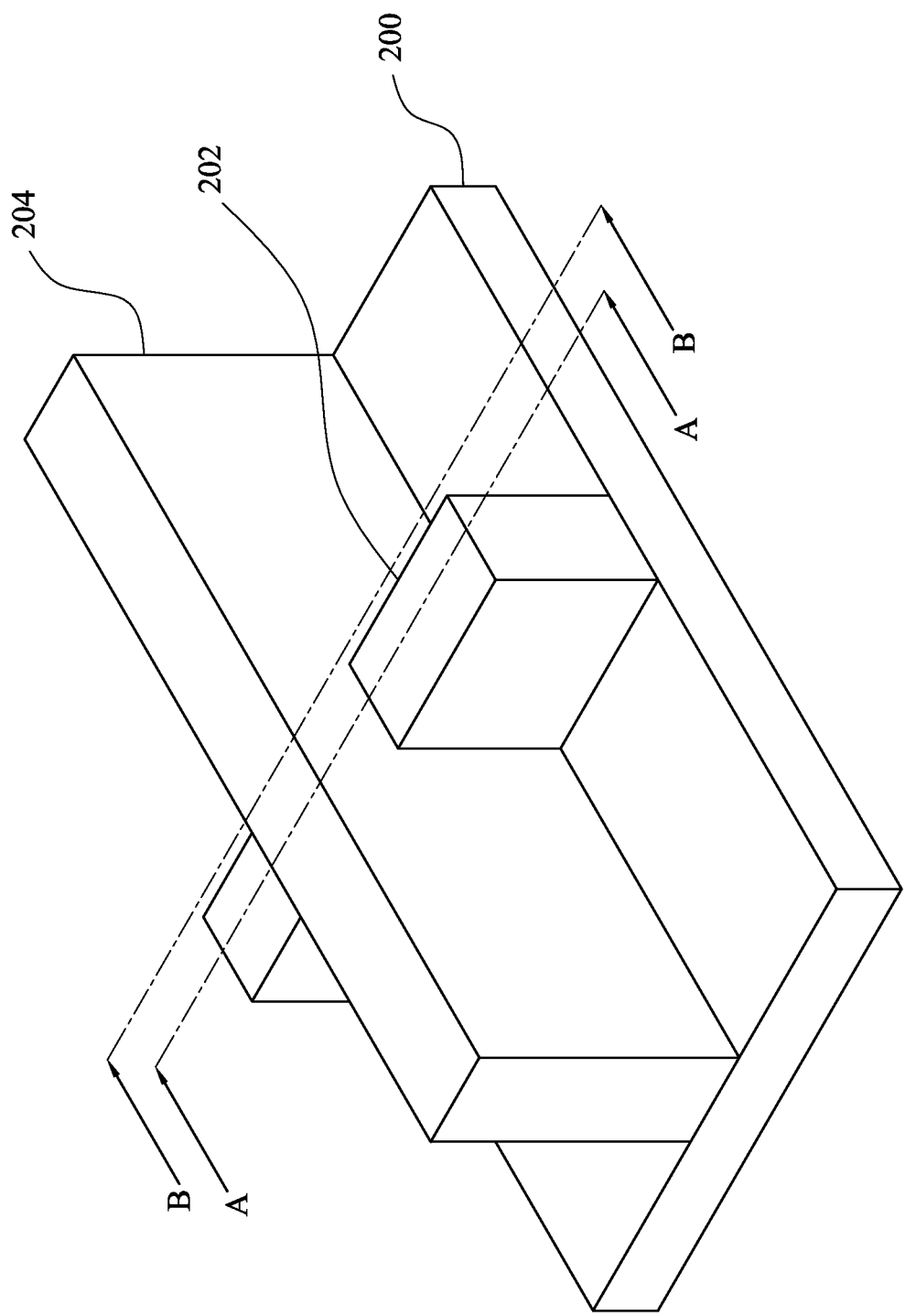
FIG. 3 is a perspective view of the Fin-FET device in FIG. 2 with a dummy gate disposed thereon, in accordance with some embodiments.
Figure 4B:
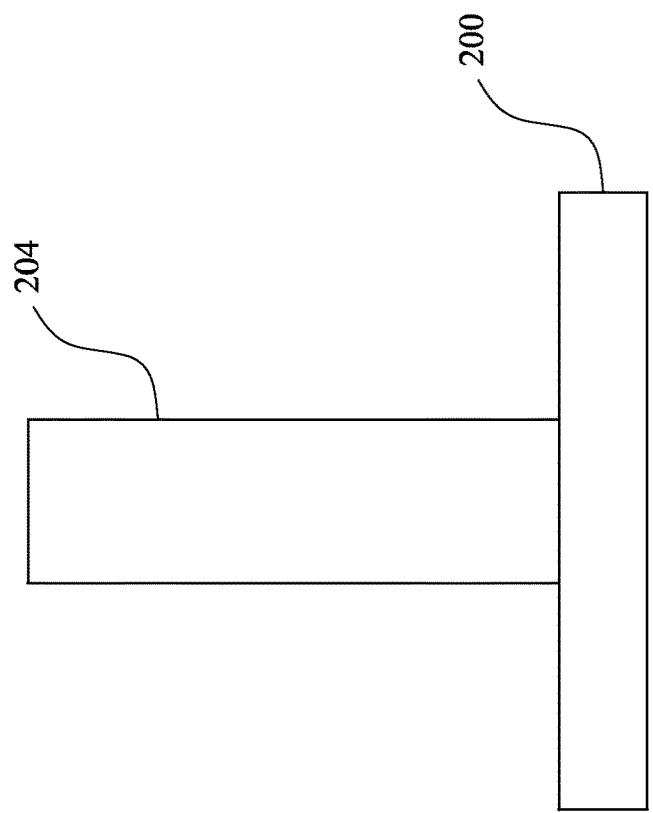
FIGS. 4A and 4B are cross-sectional views of the Fin-FET device in FIG. 3 along the line AA and BB respectively, in accordance with some embodiments.
Figure 4A:
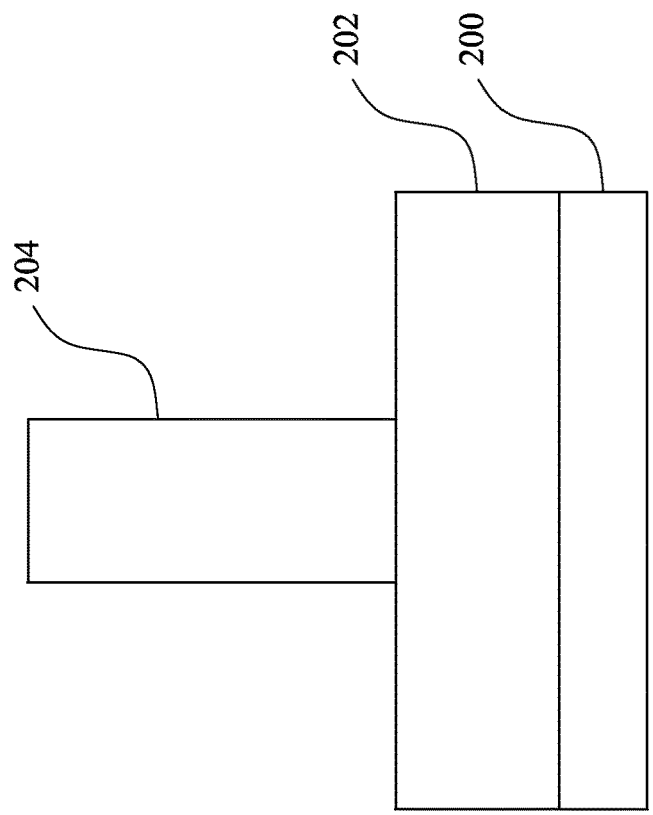

FIG. 4A is a cross-sectional view of the Fin-FET device in FIG. 3 along the line AA. The line AA is taken through the center of the fin structure 202 and the dummy gate 204. The fin structure 202 is formed on the substrate 200, and the dummy gate 204 is formed over the channel region of the fin structure 202.

FIG. 4B is a cross-sectional view of the Fin-FET device in FIG. 3 along the line BB. The line BB is taken through the interface between the sidewall of the fin structure 202 and the dummy gate 204. Since FIG. 4B is a cross-sectional view taken through the interface of the sidewall of the fin structure 202 and the dummy gate 204, only the dummy gate 204 that is formed over the substrate 200 is shown in the figure.

Referring to FIGS. 1, 5, and 6A-6F, the method 100 proceeds to operation 106, forming an oxide layer 206. In some embodiments, the oxide layer 206 is formed by an oxidation process. In other embodiments of the present disclosure, the oxidation process may be a wet or dry oxidation process. In some embodiments, the oxidation process may be a selective oxidation process. In some embodiments, the oxide layer 206 at least covers a portion of the top surface and a portion of the sidewalls of the channel region of the fin structure 202. In other embodiments, the oxide layer 206 at least covers a portion of the sidewalls of the channel region of the fin structure 202. In another embodiment, the oxidation layer 206 covers a portion of the top surface and the sidewalls of the channel region of the fin structure 202, and covers a portion of the interface between the substrate 200 and the dummy gate 204. In some embodiments, the oxide layer 206 forms on the surface of the dummy gate 204. In another embodiment, the oxide layer 206 forms on all the surfaces of the dummy gate 204, for example, a portion of the oxide layer 206 forms on the sidewalls of the dummy gate 204, the top surface of the dummy gate 204, the interface between the sidewall of the fin structure 202 and the dummy gate 204, the interface between the top surface of the fin structure 202 and the dummy gate 204, and the interface between the substrate 200 and the dummy gate 204.

In some embodiments, the oxide layer 206 may be a material such as silicon dioxide, silicon oxide or silicon oxynitride. In another embodiment, the oxide layer 206 is a reoxidation layer formed by reoxidizing the dummy gate 204. In one embodiment, the oxide layer 206 is a reoxidation layer formed by reoxidizing a dummy gate 204 made of polysilicon.

In some embodiments, the thickness of the oxidation layer 206 is in a range of 1-180 angstroms. In another embodiment, the thickness of the oxidation layer 206 is in a range of 1-160 angstroms.

Figure 5:
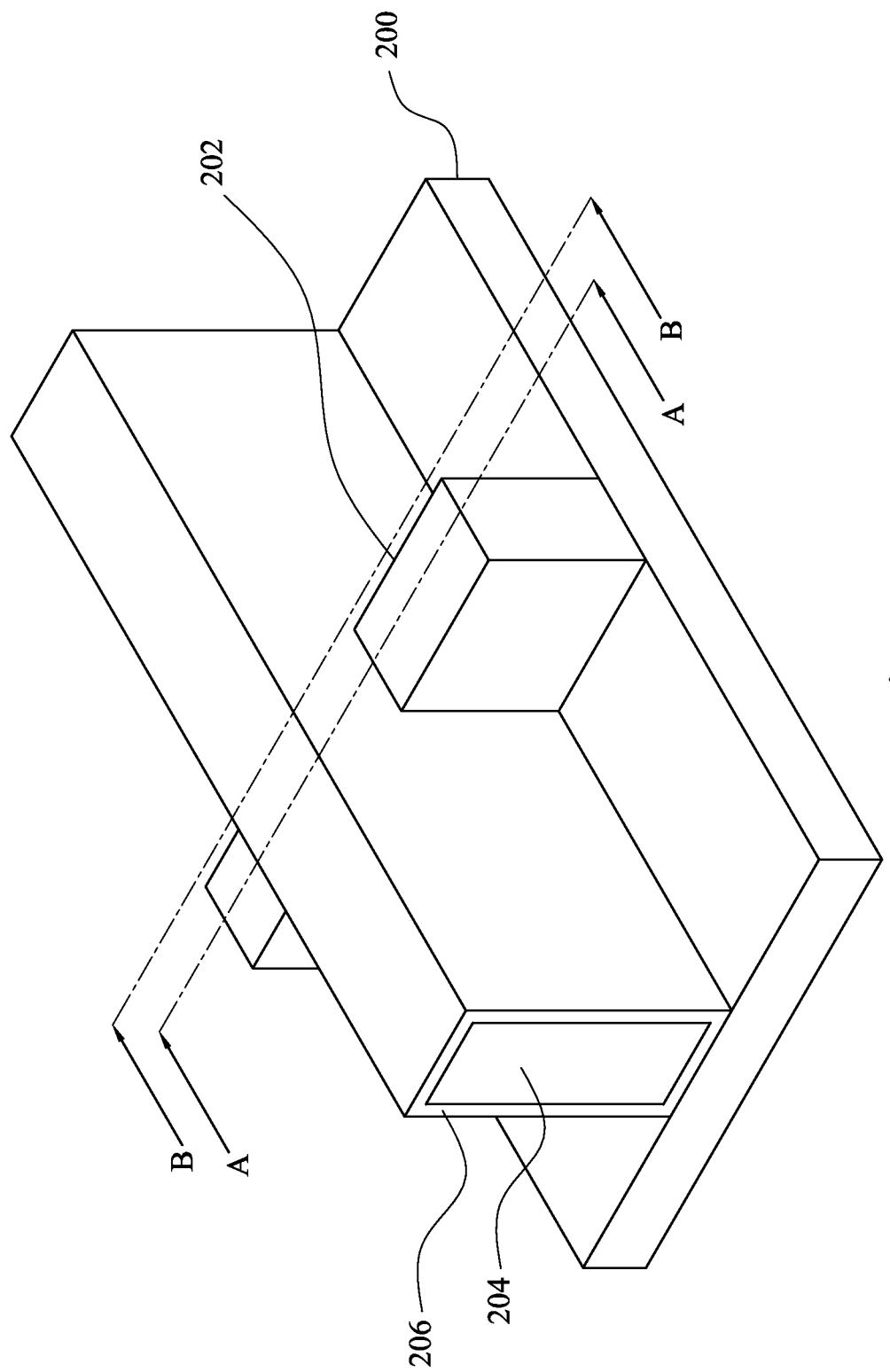
FIG. 5 is a perspective view of the Fin-FET device in FIG. 3 with an oxidation layer formed thereon, in accordance with some embodiments.

FIG. 6A is a cross-sectional view of the Fin-FET device in FIG. 5 along the line AA. The line AA is taken through the center of the fin structure 202 and the dummy gate 204. The fin structure 202 is formed on the substrate 200, and the dummy gate 204 is formed over the channel region of the fin structure 202. In some embodiments, the oxidation layer 206 covers a portion of the interface between the fin structure 202 and the dummy gate 204. In another embodiment, the oxidation layer 206 covers a portion of the top surface and a portion of the sidewalls of the channel region of the fin structure 202.

FIG. 6B is a cross-sectional view of the Fin-FET device in FIG. 5 along the line BB. The line BB is taken through the interface of the sidewall of the fin structure 202 and the dummy gate 204. Since FIG. 4B is a cross-sectional view taken through the interface of the sidewall of the fin structure 202 and the dummy gate 204, only the dummy gate 204 that is formed over the substrate 200 is shown in the figure. In some embodiments, the oxidation layer 206 covers a portion of the interface between the fin structure 202 and the dummy gate 204. In another embodiment, the oxidation layer 206 covers a portion of the top surface and a portion of the sidewalls of the channel region of the fin structure 202. In some embodiments, region 404 is referred to as a region of the oxidation layer 206 in close proximity or in contact with the source and drain regions of the fin structure 202. In some embodiments, the oxidation layer 206 formed on region 404 is a portion of the oxidation layer 206 formed between the interface of the sidewall of source and drain region of the fin structure 202 and the dummy gate 204.

In some embodiments, the profile of the oxidation layer 206 between the interface of the sidewall of the fin structure 202 and the dummy gate 204 may have a non-linear profile or a non-uniform profile. In some embodiments, the profile of the oxidation layer 206 between the interface of the sidewall of the fin structure 202 and the dummy gate 204 may have a linear profile or a uniform profile. In some embodiments, the profile of the oxidation layer 206 between a portion of the interface of the sidewall of the fin structure 202 and the dummy gate 204 may have a convex shape. In another embodiment, the profile of the oxidation layer 206 between a portion of the interface of the sidewall of the fin structure 202 and the dummy gate 204 may have a concave shape.

Figure 6D:
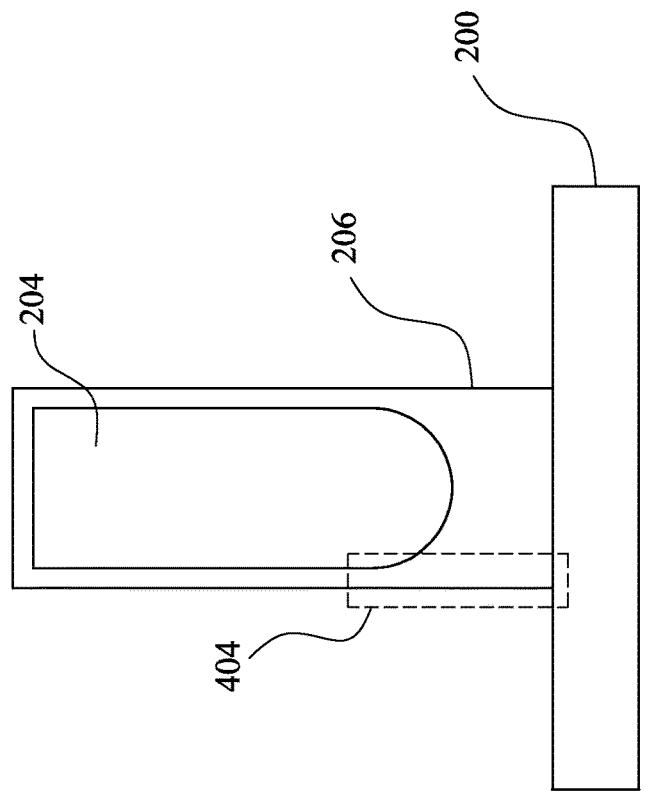
FIGS. 6C-6F are schematic diagrams illustrating the Fin-FET device in 6B with different profiles, in accordance with some embodiments.
Figure 6C:
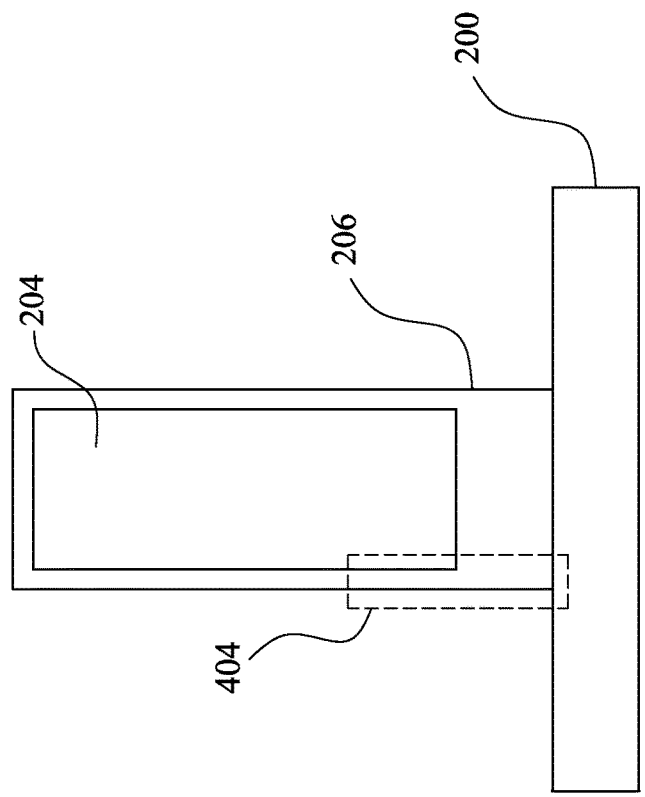

FIGS. 6C to 6F are schematic diagrams illustrating the Fin-FET device in 6B with different profiles, in accordance with some embodiments. In some embodiments, the profile of the oxidation layer 206 between a portion of the interface of the sidewall of the fin structure 202 and the dummy gate 204 may have a profile as shown in FIGS. 6C and 6D. In other embodiments, the reoxidation process is controlled to form an oxidation layer 206 that covers a portion of the interface of the sidewall of the fin structure 202 and the dummy gate 204. In other embodiments, the oxidation layer 206 that covers region 404 may prevent etchants from reaching the underlying source and drain regions during dummy gate removal. In some embodiments, the oxidation layer 206 forms on the surface of the dummy gate 204 and diffuses inwards and meets at the center of the dummy gate thereby forming the oxidation layer 206 between the interface of the sidewall of the fin structure 202 and the dummy gate 204. In another embodiment, the oxidation layer 206 forms on the surface of the dummy gate 204 and diffuses inwards and but does not meet at the center of the dummy gate.

Figure 6F:
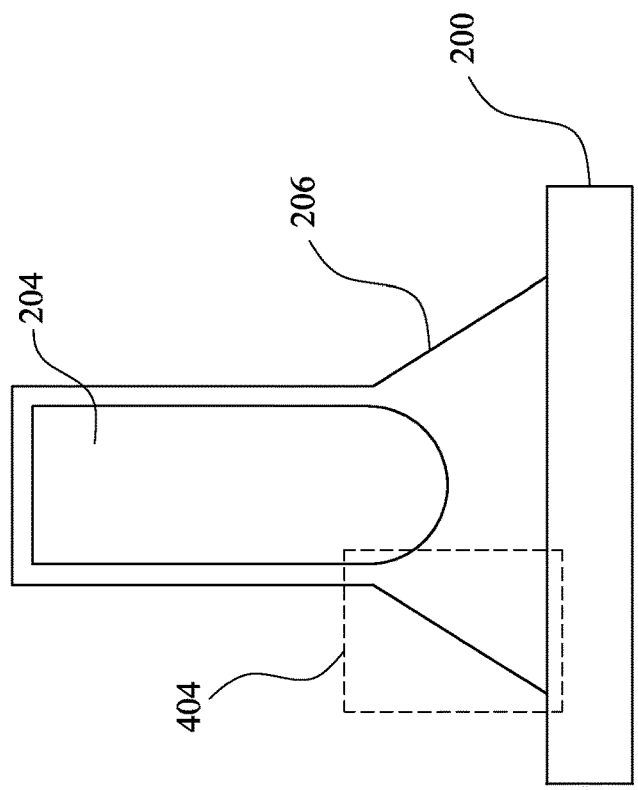
Figure 6E:
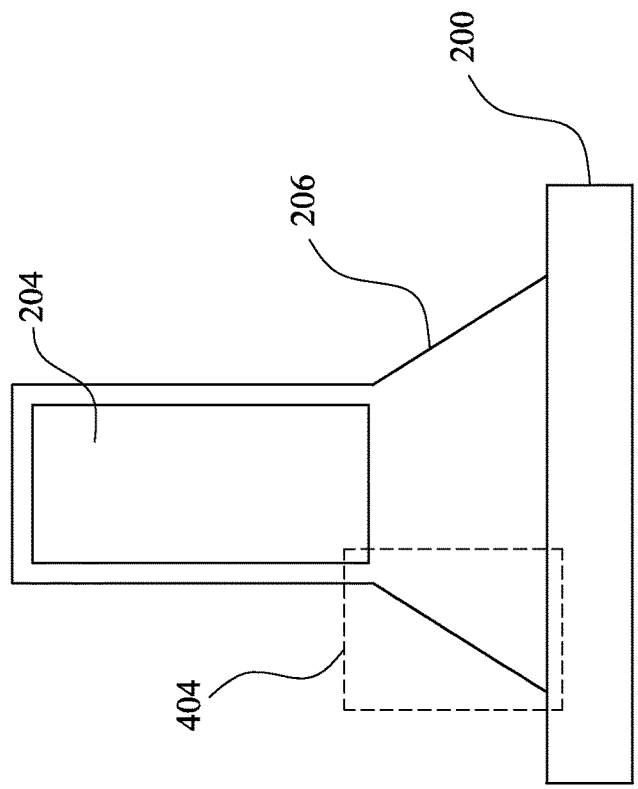

In other embodiments, in a dummy gate with tapered sidewalls, the profile of the oxidation layer 206 between the interface of the sidewall of the fin structure 202 and the dummy gate 204 may have a profile as shown in FIGS. 6E and 6F. In some embodiments, since region 404 of the dummy gate with tapered sidewalls will come in close contact with the epitaxial source and drain regions of the fin structure 202, the oxidation layer 206 formed on region 404 may act as a barrier to prevent the etchant from etching the underlying epitaxial source and drain regions during dummy gate removal. In another embodiment, when the dummy gate have tapered sidewalls and an source and drain region is formed, the oxidation layer 206 that covers region 404 may prevent etchants from reaching the underlying source and drain regions during dummy gate removal.

Referring to FIGS. 7A and 7B, which are schematic diagrams illustrating the Fin-FET device in FIGS. 6A and 6B with spacers formed thereon, in accordance with some embodiments. In some embodiments, the Fin-FET device in FIGS. 6A and 6B may optionally include spacers 208 formed thereon. In some embodiments, the oxidation layer 206 may be used as a spacer alone. In another embodiment, the oxidation layer 206 may be used along with spacers 208 as spacers.

In some embodiments, the spacers 208 may be a material such as silicon nitride, silicon oxide, silicon carbide, silicon nitride doped with carbon, silicon oxynitride or silicon oxynitride doped with carbon.

In some embodiments, the thickness of the spacers 208 is in a range of 1-170 angstroms. In another embodiment, the thickness of the spacers 208 is in a range of 1-150 angstroms.

Figure 8B:
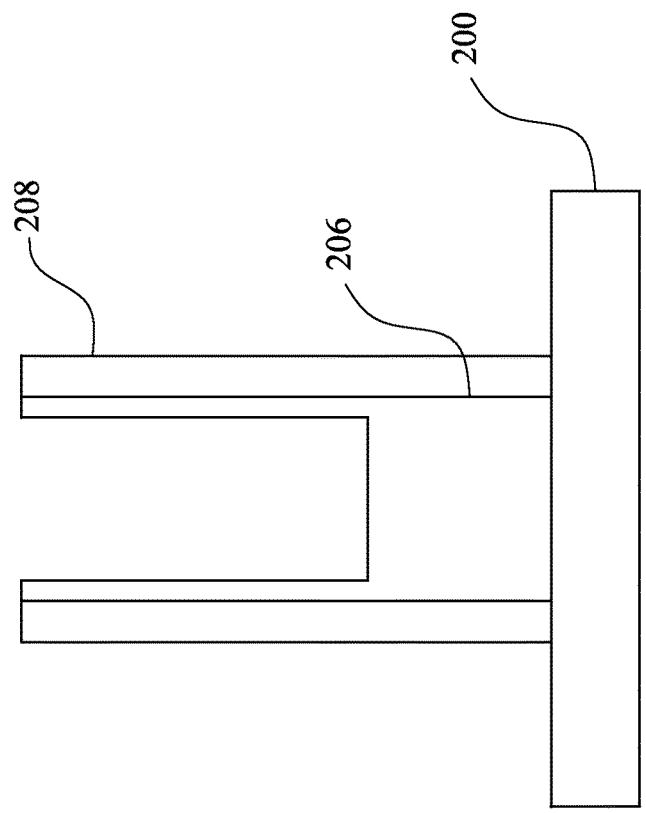
FIGS. 8A and 8B are schematic diagrams illustrating the Fin-FET device in FIGS. 7A and 7B after the dummy gate has been removed, in accordance with some embodiments.
Figure 8A:
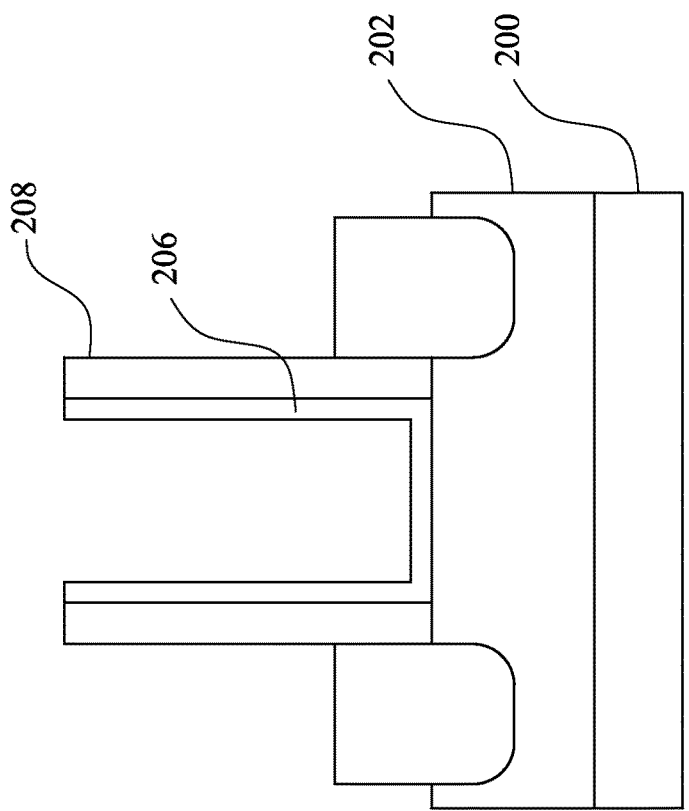

Referring to FIGS. 1, 8A and 8B, the method 100 proceeds to operation 108, removing the dummy gate 204.

FIGS. 8A and 8B are schematic diagrams illustrating the Fin-FET device in FIGS. 7A and 7B after the dummy gate has been removed, in accordance with some embodiments. In some embodiments, subsequent layers such as inter-layer dielectric layers and contact etch stop layers may be disposed onto the substrate by a suitable method such as CVD (chemical vapor deposition), MOCVD (metal organic chemical vapor deposition), PVD (physical vapor deposition), MBE (molecular beam epitaxy) or any other suitable method. One should note that some of the structures have been omitted in the figures for the purpose of simplicity and clarity. In some embodiments, an epitaxial source and drain region 304 may optionally be formed by a suitable method.

In some embodiments, the Fin-FET device may be planarized by a CMP (chemical mechanical polishing) process to expose the dummy gate 204 and then removed by a suitable process. In some embodiments, other suitable methods may be used to expose the dummy gate 204. In other embodiments, the dummy gate 204 is removed by a suitable etching process. In some embodiments, the etching process may be a dry or wet etching process. In some embodiments, the etching process may be an isotropic or anisotropic etching process. In other embodiments of the present disclosure, an epi loop process is conducted before removing the dummy gate to form epitaxial source and drain regions. In another embodiment, the epi loop process is conducted after removing the dummy gate to form epitaxial source and drain regions 304.

In some embodiments, the oxidation layer 206 between the interface of the sidewall of the fin structure 202 and the dummy gate 204 may act as a barrier to prevent the etchant from etching the fin structure 202. In another embodiment, the oxidation layer 206 between the interface of the substrate 200 and the dummy gate 204 may act as a barrier to prevent the etchant from etching the substrate 200. In some embodiments, the oxidation layer 206 formed by reoxidizing the dummy gate 204 is an uniform layer that covers the interface between the sidewall of the fin structure 202 and the dummy gate 204 completely, therefore no seams or weak points are formed at the corners of the fin structure 202 and thereby preventing the etchant from etching the fin structure 202. In other embodiments, the oxidation layer 206 may act as a barrier to prevent the etchant from etching the underlying surfaces in a gate last process. In some embodiments, a portion of the oxidation layer 206 between the interface of the sidewall of the fin structure 202 and the dummy gate 204 may act as a barrier to prevent the etchant from etching the source and drain regions of the fin structure 202. In another embodiment, a portion of the oxidation layer 206 between the interface of the sidewall of the fin structure 202 and the dummy gate 204 may act as a barrier to prevent the etchant from etching the epitaxial source and drain regions 304.

Figure 9A:
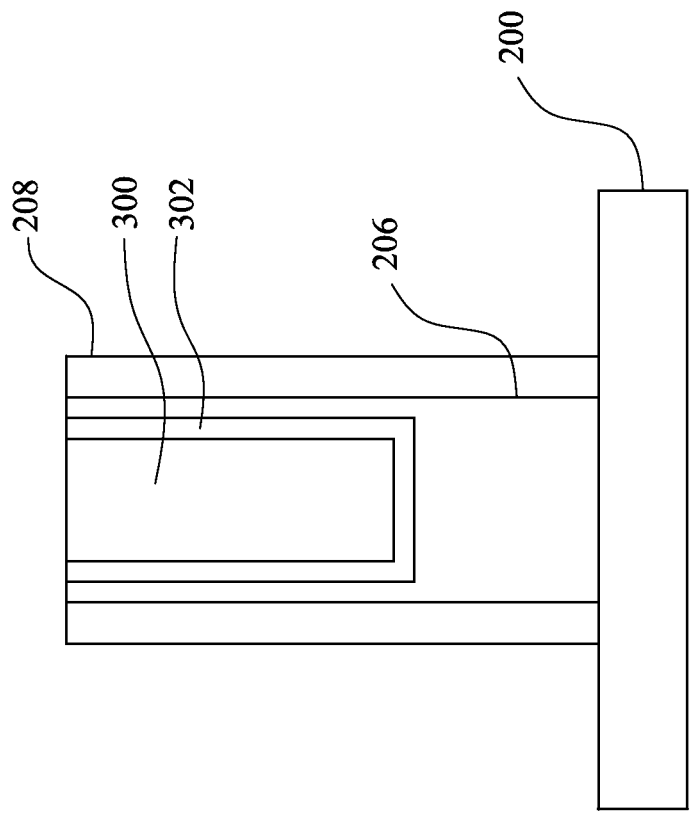
FIGS. 9A and 9B are schematic diagrams illustrating the Fin-FET device in FIGS. 8A and 8B with the gate stack formed thereon, in accordance with some embodiments.
Figure 9B:
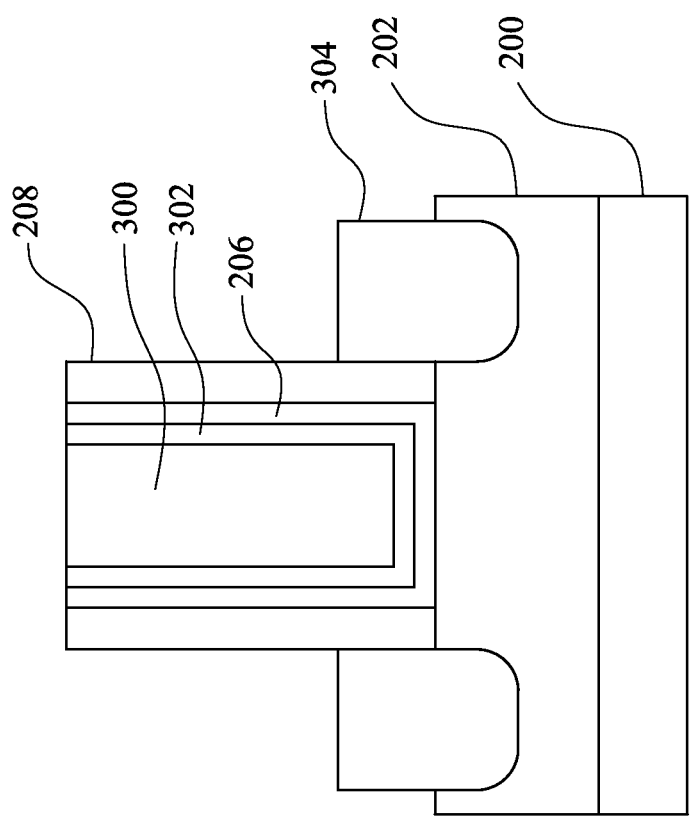

Referring to FIGS. 1, 9A and 9B, the method 100 proceeds to operation 110, depositing gate dielectric 302 and gate electrode 300. FIGS. 9A and 9B are schematic diagrams illustrating the Fin-FET device in FIGS. 8A and 8B with the gate stack formed thereon. In some embodiments, the gate dielectric 302 and gate electrode 300 are referred to as a gate stack, however, the gate stack is not limited thereto, other additional layers and features of the gate stack have been omitted in the figures for the purpose of simplicity and clarity. In some embodiments, an epi loop process may optionally be conducted after forming the gate stack to form epitaxial source and drain regions 304.

In some embodiments, the gate dielectric 302 may be a material such as hafnium oxide, hafnium silicon oxide, aluminum oxide, zirconium oxide or zirconium silicon oxide.

In other embodiments, the gate electrode 300 may be a metal such as Al, Cu, W, Ti, Ta, TiN, TiAl, TiAlN, TaN, NiSi, CoSi, other conductive materials with a work function compatible with the substrate material, or combinations thereof.

The gate electrode 300 may be formed by using a suitable process such as ALD, CVD, PVD, plating, or combinations thereof.

FIG. 9A is schematic diagram illustrating the Fin-FET device in FIG. 8A with gate dielectric 302 and gate electrode 300 disposed thereon, in accordance with some embodiments. In some embodiments, the fin structure 202 is formed on the substrate 200, and the gate dielectric 302 and gate electrode 300 is disposed over the channel region of the fin structure 202. In some embodiments, the oxidation layer 206 covers a portion of the interface between the fin structure 202 and the gate dielectric 302. In some embodiments, the oxidation layer 206 is used along with the gate dielectric 302 as a gate dielectric. In another embodiment, a gate dielectric 302 is not disposed and the oxidation layer 206 is used alone as a gate dielectric. In some embodiments, a spacer 208 may optionally be formed. In some embodiments, the oxidation layer 206 interpose between a portion of the fin structure 202 and the gate dielectric 302, and the oxidation layer 206 interpose between the spacer 208 and the gate dielectric 302.

FIG. 9B is a schematic diagram illustrating the Fin-FET device in FIG. 8B with gate dielectric 302 and gate electrode 300 disposed thereon, in accordance with some embodiments. FIG. 9B is a cross-sectional view taken through the interface of the sidewall of the fin structure 202 and the gate stack. In some embodiments, the gate dielectric 302 and gate electrode 300 is disposed over the substrate 200. In other embodiments, the oxidation layer 206 covers a portion of the interface between the fin structure 202 and the gate dielectric 302. In some embodiments, the oxidation layer 206 is used along with the gate dielectric 302 as a gate dielectric. In another embodiment, a gate dielectric 302 is not disposed and the oxidation layer 206 is used alone as a gate dielectric. In some embodiments, a portion of the oxidation layer 206 interpose between the fin structure 202 and the gate dielectric 302, and the oxidation layer 206 interpose between the spacer 208 and the gate dielectric 302. One should note that the shape of the oxidation layer 206 that interpose between the fin structure 202 and the gate dielectric 302 in FIG. 9B is merely illustrated as an example.

Figure 10:
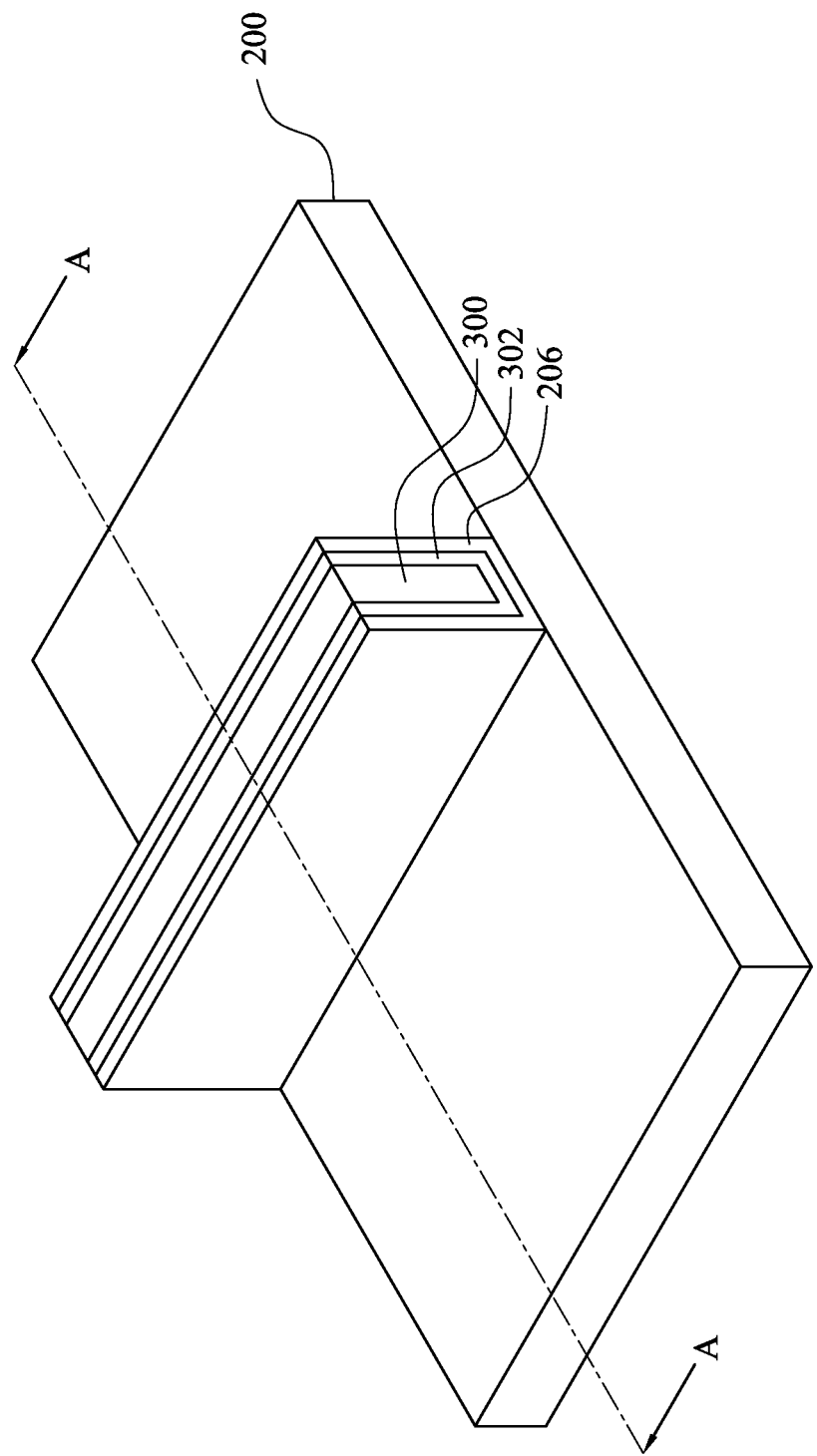
FIG. 10 is a perspective view of a planar FET device at an intermediate stage of fabrication that may utilize the method depicted in FIG. 1, in accordance with some embodiments.
Figure 11:
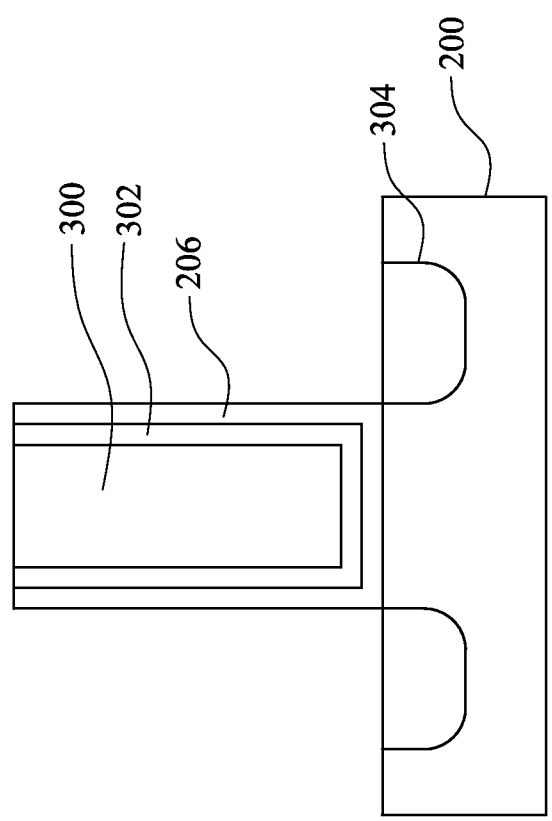
FIG. 11 is a cross-sectional view of the planar FET device at an intermediate stage of fabrication along the line AA in FIG. 10, in accordance with some embodiments.

FIGS. 10 and 11 are figures illustrating a planar FET device that may utilize the method depicted in FIG. 1, in accordance with some embodiments. With reference to FIGS. 1, 10, 11 and other figures, the method 100 and the planar FET device in FIGS. 10 and 11 are collectively described.

FIG. 10 is a perspective view of a planar FET device at an intermediate stage of fabrication that may utilize the method depicted in FIG. 1, in accordance with some embodiments. The semiconductor device in FIG. 10 includes a substrate 200 and a gate stack disposed thereon, the gate stack includes an oxidation layer 206, a dielectric 302 and a gate electrode 300. In some embodiments, the channel region is a channel region on the substrate 200. In other embodiments, the gate stack may have a tapered sidewall. In some embodiments, the oxidation layer 206 is used along with the gate dielectric 302 as a gate dielectric. In another embodiment, a gate dielectric 302 is not disposed and the oxidation layer 206 is used alone as a gate dielectric. In some embodiments, an epitaxial source and drain regions may optionally be formed by a suitable method. The term "substrate" as used herein refers to a layer of material that serves as a basis for subsequent processing operations. One should note that some of the structures have been omitted for the purpose of simplicity and clarity.

In some embodiments, the substrate 200 may be a 200 mm, 300 mm or 450 mm silicon wafer, or other substrate used to fabricate microelectronic devices and the like. In one or more embodiments, the substrate 200 may be a material such as crystalline silicon (e.g., Si<100>, Si<111> or Si<001>), silicon oxide, strained silicon, silicon$_{(1-x)}$germanium$_x$, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. Furthermore, the substrate 200 can also include dielectric materials such as silicon dioxide, organosilicates, and carbon doped silicon oxides.

The substrate 200 may also include one or more conductive metals, such as nickel, titanium, platinum, molybdenum, rhenium, osmium, chromium, iron, aluminum, copper, tungsten, or combinations thereof. Furthermore, the substrate 200 can include any other materials such as metal nitrides, metal oxides and metal alloys, depending on the application. In some embodiments, the substrate 200 can form a contact structure, a metal silicide layer, or a gate structure including a gate dielectric layer and a gate electrode layer to facilitate connecting with an interconnect feature, such as a plug, via, contact, line, and wire, subsequently formed thereon, or suitable structures utilized in semiconductor devices.

In other embodiments, the substrate 200 may include a plurality of isolation structures such as shallow trench isolation (STI) structures to isolate the active regions. In another embodiment, the substrate 200 may be a bulk silicon substrate or a silicon-on-insulator substrate with expitaxial silicon disposed thereon.

In some embodiments, the oxide layer 206 may be a material such as silicon dioxide, silicon oxide or silicon oxynitride. In another embodiment, the oxide layer 206 is a reoxidation layer formed by reoxidizing a dummy gate. In one embodiment, the oxide layer 206 is a reoxidation layer formed by reoxidizing a dummy gate made of polysilicon.

In some embodiments, the thickness of the oxidation layer is in a range of 1-170 angstroms. In another embodiment, the thickness of the oxidation layer is in a range of 1-150 angstroms.

In some embodiments, the planar FET device in FIGS. 10 and 11 may optionally include spacers formed thereon. In some embodiments, the oxidation layer 206 may be used as a spacer alone. In another embodiment, the oxidation layer 206 may be used along with another spacer.

In some embodiments, the spacers may be a material such as silicon nitride, silicon oxide, silicon carbide, silicon nitride doped with carbon, silicon oxynitride or silicon oxynitride doped with carbon.

In some embodiments, the thickness of the spacers is in a range of 1-170 angstroms. In another embodiment, the thickness of the spacers is in a range of 1-150 angstroms.

In some embodiments, the gate dielectric 302 may be a material such as hafnium oxide, hafnium silicon oxide, aluminum oxide, zirconium oxide or zirconium silicon oxide.

In other embodiments, the gate electrode 300 may be a metal such as Al, Cu, W, Ti, Ta, TiN, TiAl, TiAlN, TaN, NiSi, CoSi, other conductive materials with a work function compatible with the substrate material, or combinations thereof.

The gate electrode 300 may be formed by using a suitable process such as ALD, CVD, PVD, plating, or combinations thereof.

In some embodiments, the gate stack may be formed by first forming a dummy gate and later replaced with a metal gate. In some embodiments, the dummy gate may be formed by forming a sacrificial layer on the substrate 200 and then selectively etching the sacrificial layer to form the dummy gate. In some embodiments, subsequent layers such as inter-layer dielectric layers and contact etch stop layers may be disposed onto the substrate by a suitable method such as CVD (chemical vapor deposition), MOCVD (metal organic chemical vapor deposition), PVD (physical vapor deposition), MBE (molecular beam epitaxy) or any other suitable method. One should note that some of the structures have been omitted in the figures for the purpose of simplicity and clarity.

In some embodiments, a portion of the outer surface of the dummy gate may be oxidized and then the oxidized portion of the dummy gate is removed to reduce the width of the dummy gate. In other embodiments, the dummy gate may have a tapered sidewall. In another embodiment, the dummy gate may be a material of polysilicon, other suitable materials and suitable materials doped with carbon or hydrogen. In some embodiments, the dummy gate is formed over a channel region of the substrate 200. In some embodiments, during removal of the dummy gate, the oxidation layer 206 can act as a barrier to prevent damage to the underlying features such as the source and drain regions. In another embodiment, during removal of the dummy gate, the oxidation layer 206 can act as a barrier to prevent damage to the underlying features such as expitaxial source and drain regions.

In some embodiments, the oxide layer 206 is formed by an oxidation process. In other embodiments, the oxidation process may be a wet or dry oxidation process. In some embodiments, the oxidation process may be a selective oxidation process. In some embodiments, the oxide layer 206 at least covers a portion of the channel region of the substrate 200. In some embodiments, the oxide layer 206 forms on the surface of the dummy gate. In another embodiment, the oxide layer 206 forms on all the outer surfaces of the dummy gate, for example, the oxide layer 206 forms on the sidewalls of the dummy gate, the top surface of the dummy gate, and the interface between the substrate 200 and the dummy gate.

In some embodiments, the thickness of the oxidation layer is in a range of 1-180 angstroms. In another embodiment, the thickness of the oxidation layer is in a range of 1-160 angstroms.

FIG. 11 is a cross-sectional view of the planar FET device at an intermediate stage of fabrication along the line AA in FIG. 10, in accordance with some embodiments. In some embodiments, the gate stack is formed on the substrate 200, the gate dielectric 302 and gate electrode 300 is disposed over the channel region of the substrate 200, and a source and drain region 304 is formed by a suitable method. In some embodiments, the oxidation layer 206 covers a portion of the interface between the substrate 200 and the gate dielectric 302. In some embodiments, the oxidation layer 206 is used along with the gate dielectric 302 as a gate dielectric. In another embodiment, a gate dielectric 302 is not disposed and the oxidation layer 206 is used alone as a gate dielectric. In some embodiments, an epitaxial source and drain region may optionally be formed by a suitable method. In other embodiments, the oxidation layer 206 interposes between the substrate 200 and the gate dielectric 302.

In some embodiments of the present disclosure, the dummy gate is reoxidized to form an oxidation layer that covers a portion of the channel region. In some embodiments, during removal of the dummy gate, the oxidation layer can act as a barrier to prevent damage to the underlying features such as the source and drain regions. In other embodiments, the oxidation layer can act as a spacer, and the oxidation layer can be used to prevent damage to the source and drain regions. In some embodiments, the oxidation layer can be used along with another spacer to act as a spacer. In other embodiments, the oxidation layer can act as a gate dielectric, and the oxidation layer can be used to prevent damage to the source and drain regions. In some embodiments, the oxidation layer can be used along with another gate dielectric to act as a gate dielectric.

In some embodiments, a Fin-FET semiconductor device is provided, the semiconductor device includes a semiconductor substrate, a semiconductor fin that extends from the semiconductor substrate and a gate stack disposed over a channel region of the semiconductor fin. In some embodiments, the gate stack includes an oxidation layer, a gate dielectric and a gate electrode. In other embodiments, the oxidation layer at least covers a portion of the sidewalls of the channel region.

In other embodiments, a planar semiconductor device is provided, the semiconductor device includes a semiconductor substrate with a channel region and a gate stack disposed over the channel region of the semiconductor substrate. In some embodiments, the gate stack includes an oxidation layer, a gate dielectric and a gate electrode. In other embodiments, the oxidation layer at least covers a portion of the channel region.

In some embodiments, a method of forming a semiconductor device is provided, the method includes providing a semiconductor substrate with a channel region, forming a dummy gate on the channel region, forming an oxidation layer that at least covers a portion of the channel region, removing the dummy gate, and depositing a gate dielectric and a gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a semiconductor substrate;
    a semiconductor fin extending from the semiconductor substrate and comprising a channel region, a source region and a drain region, wherein said channel region is disposed between said source region and said drain region; and
    a gate stack disposed over said channel region of said semiconductor fin, wherein said gate stack comprises an oxidation layer, a gate dielectric and a gate electrode, wherein said oxidation layer surrounds a sidewall of said gate dielectric and said gate electrode and is in direct contact with said source region and said drain region, wherein said gate dielectric is between said gate electrode and said oxidation layer and includes a different material than said oxidation layer.

2. The semiconductor device of claim 1, wherein said semiconductor device further comprises a spacer.

3. The semiconductor device of claim 2, wherein the thickness of said spacer is in a range of 1-150 angstroms.

4. The semiconductor device of claim 1, wherein said gate dielectric is hafnium oxide, hafnium silicon oxide, aluminum oxide, zirconium oxide or zirconium silicon oxide.

5. The semiconductor device of claim 1, wherein said oxidation layer is silicon dioxide, silicon oxide or silicon oxynitride.

6. The semiconductor device of claim 5, wherein the thickness of said oxidation layer is in a range of 1-160 angstroms.

7. The semiconductor device of claim 1, wherein a bottom wall of said oxidation layer is between said semiconductor fin and said gate dielectric.

8. The semiconductor device of claim 2, wherein a sidewall of said oxidation layer is between said spacer and said gate dielectric.

9. The semiconductor device of claim 2, wherein said spacer comprises silicon nitride, silicon oxide, silicon carbide, silicon nitride doped with carbon, silicon oxynitride or silicon oxynitride doped with carbon.

10. A semiconductor device comprising:
a semiconductor substrate comprising a channel region, a source region and a drain region, wherein said channel region is disposed between said source region and said drain region; and
a gate stack disposed over said channel region of said semiconductor substrate, wherein said gate stack comprises an oxidation layer, a gate dielectric and a gate electrode, wherein said oxidation layer surrounds said gate dielectric and said gate electrode, said entire oxidation layer being made of the same material and including a sidewall formed on a sidewall of said gate dielectric, said gate dielectric being between said gate electrode and said oxidation layer.

11. The semiconductor device of claim 10, wherein said semiconductor device further comprises a spacer.

12. The semiconductor device of claim 10, wherein a bottom wall of said oxidation layer is between said channel region of said semiconductor substrate and said gate dielectric.

13. The semiconductor device of claim 10, wherein the thickness of said oxidation layer is in a range of 1-160 angstroms.

14. The semiconductor device of claim 11, wherein the thickness of said spacer is in a range of 1-150 angstroms.

15. A semiconductor device comprising:
a semiconductor substrate;
a semiconductor fin extending from the semiconductor substrate and comprising a channel region, a source region and a drain region, wherein the channel region is disposed between the source region and the drain region; and
a gate stack disposed over said channel region, wherein: the gate stack comprises an oxidation layer, a gate dielectric and a gate electrode; said gate dielectric is between said gate electrode and said oxidation layer; said gate dielectric surrounds said gate electrode; said oxidation layer surrounds said gate dielectric; said oxidation layer includes a sidewall formed on a sidewall of said gate dielectric; and said entire oxidation layer is made of the same material.

16. The semiconductor device of claim 15, wherein a bottom wall of said oxidation layer is between said semiconductor fin and said gate dielectric.

17. The semiconductor device of claim 15, wherein said sidewall and a bottom wall of said oxidation layer have the same thickness.

18. The semiconductor device of claim 15, further comprising an inter-layer dielectric layer above the semiconductor substrate and in contact with said sidewall of said oxidation layer.

19. The semiconductor device of claim 15, wherein one of said source and drain regions includes a raised portion above the semiconductor substrate and in contact with said sidewall of said oxidation layer.

20. The semiconductor device of claim 15, wherein the oxidation layer is formed by oxidizing a dummy gate.

* * * * *